(12) United States Patent
Hikmet et al.

(10) Patent No.: US 11,353,163 B2
(45) Date of Patent: Jun. 7, 2022

(54) LIGHTING DEVICE WITH SPARKLE EFFECT

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/299,612

(22) PCT Filed: Dec. 10, 2019

(86) PCT No.: PCT/EP2019/084338
§ 371 (c)(1),
(2) Date: Jun. 3, 2021

(87) PCT Pub. No.: WO2020/120438
PCT Pub. Date: Jun. 18, 2020

(65) Prior Publication Data
US 2022/0018499 A1  Jan. 20, 2022

(30) Foreign Application Priority Data

Dec. 13, 2018 (EP) ..................................... 18212198

(51) Int. Cl.
*F21K 9/232* (2016.01)
*F21K 9/65* (2016.01)
(Continued)

(52) U.S. Cl.
CPC ................. *F21K 9/232* (2016.08); *F21K 9/65* (2016.08); *H01L 33/50* (2013.01); *H01L 33/56* (2013.01); *F21Y 2115/10* (2016.08)

(58) Field of Classification Search
CPC ............. F21K 9/232; F21K 9/65; H01L 33/50
See application file for complete search history.

(56) References Cited

U.S. PATENT DOCUMENTS

2010/0290234 A1\* 11/2010 Bierhuizen ........... F21V 7/0091
362/311.02
2014/0369036 A1  12/2014 Feng
2018/0195690 A1  7/2018 Ryohwa et al.

FOREIGN PATENT DOCUMENTS

CN       201069064 Y     6/2008
CN       201589120 U     9/2010
(Continued)

*Primary Examiner* — Karabi Guharay
(74) *Attorney, Agent, or Firm* — Daniel J. Piotrowski

(57) ABSTRACT

A lighting device comprising solid state light-emitting elements mounted on a carrier substrate, an encapsulant comprising a luminescent material, the encapsulant enclosing the light emitting surfaces of the solid state light-emitting elements and being configured to at least partly convert light emitted by the solid state light-emitting element to wavelength converted light, and a plurality of light-transmissive particles contained at least partly within the encapsulant, the light-transmissive particles having an average longest dimension extension in the range 0.4 to 1.5 times a layer thickness of said encapsulant over the light emitting surfaces. The light-transmissive particles may disrupt the luminescent effect of the encapsulant material to create a sparkling effect.

14 Claims, 3 Drawing Sheets

(51) Int. Cl.
*H01L 33/50* (2010.01)
*H01L 33/56* (2010.01)
*F21Y 115/10* (2016.01)

(56) References Cited

FOREIGN PATENT DOCUMENTS

| | | | | |
|---|---|---|---|---|
| CN | 201836802 U | 5/2011 | | |
| CN | 205244927 U | 5/2016 | | |
| CN | 206439675 U | 8/2017 | | |
| WO | 2015033890 A1 | 3/2015 | | |
| WO | 2017153252 A1 | 9/2017 | | |
| WO | WO-2017153252 A1 * | 9/2017 | .............. | F21V 11/14 |
| WO | 2017186150 A1 | 11/2017 | | |
| WO | 2018041923 A1 | 3/2018 | | |

\* cited by examiner

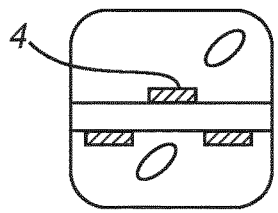
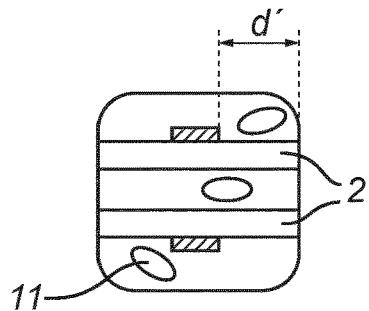
Fig. 2b    Fig. 2c
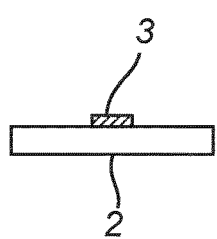
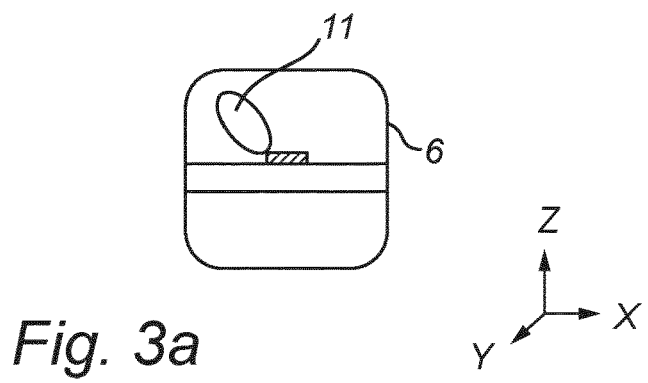
Fig. 3a
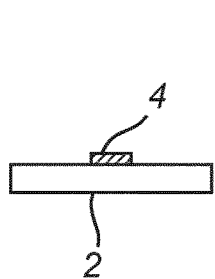 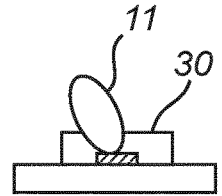 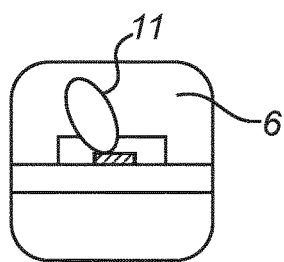
Fig. 3b
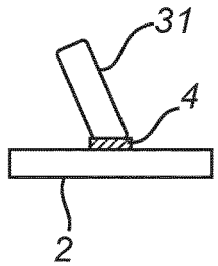 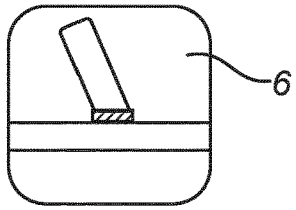
Fig. 3c

_US 11,353,163 B2_

LIGHTING DEVICE WITH SPARKLE EFFECT

CROSS-REFERENCE TO PRIOR APPLICATIONS

This application is the U.S. National Phase application under 35 U.S.C. § 371 of International Application No. PCT/EP2019/084338, filed on Dec. 10, 2019, which claims the benefit of European Patent Application No. 18212198.8, filed on Dec. 13, 2018. These applications are hereby incorporated by reference herein.

FIELD OF THE INVENTION

The present invention relates to a solid state lighting device having a sparkling effect, and to a method for manufacturing the same.

BACKGROUND OF THE INVENTION

Incandescent lamps are rapidly being replaced by solid state light sources e.g. light emitting diodes (LED) based lighting solutions. It is nevertheless appreciated and desired by users to have retrofit lamps which have the look of an incandescent bulb. For this purpose, one can simply make use of the infrastructure for producing incandescent lamps based on glass and replace the conventional filament with LED filaments emitting white light. One of the concepts is based on LED filaments placed in such a bulb. The appearances of these lamps are highly appreciated as they look highly decorative. Further, it is desirable to introduce additional lighting effects to such decorative LED lighting devices. In particular, a sparkling appearance in the LED light bulbs is anticipated to be highly appreciated by the viewers. Namely that such effect is widely used in various industries to create more captivating and fashionable appearances.

Conventionally, the efforts to create such sparkling effect in lighting systems have been directed towards using a light source such as a conventional light bulb, an LED or high power halogen light bulbs and illuminating a surface provided with a layer of glittering materials such as applying a layer of glittering particles on a glass surface. Therefore, achieving a sparkling effect in the reflected light from the surface. In an alternative solution such light sources are placed in the vicinity of a lead glass crystal. In this manner the system provides the effect without the need for separate installation schemes for the light emitting source and a separate glitter surface. These approaches however have their accompanying drawbacks and are usually costly and cumbersome to implement.

In an alternative solution disclosed in WO2017153252, a lighting device is presented which comprises an exposed outer surface and at least one primary light source disposed within a chamber. The chamber has an internal surface arrangement including a first surface portion and an opposing second surface portion. The primary light source is located on the first surface portion. The second surface portion is translucent and the primary light source illuminates the plurality of light exit areas delimited by the translucent second surface thus providing both functional lighting for illuminating a space while having a spatially dynamic sparkling light display.

Even though this document discloses a more compact approach, its solution follows the principle of having illuminating sources and incidence panels. Further, this approach presents a complex solution of creating secondary light sources having light-emitting surfaces with anisotropic luminance.

Therefore, there is a need in the field to provide more versatile, cost-effective, efficient and straightforward solutions for lighting devices delivering the desired sparkling effects.

SUMMARY OF THE INVENTION

It is accordingly an object of the present invention to improve the current state of the art and to mitigate at least some of the above mentioned shortcomings.

These and other objects are achieved by providing a solid state lighting device having a sparkling effect and a method of producing a solid state lighting device having a sparkling effect as defined in the appended claims.

According to a first aspect of the present invention, there is provided a lighting device providing a sparkling visual effect, comprising at least one solid state light-emitting element mounted on a carrier substrate, the solid state light-emitting element configured to emit light from a light emitting surface, an encapsulant comprising a luminescent material, the encapsulant enclosing the light emitting surface(s) of the at least one solid state light-emitting element and being configured to at least partly convert light emitted by the solid state light-emitting element to wavelength converted light, and a plurality of light-transmissive particles contained at least partly within the encapsulant, the light-transmissive particles having an average longest dimension extension in the range 0.4 to 1.5 times a layer thickness of the encapsulant over the light emitting surface(s).

The lighting device may sometimes be referred to as "LED filament" in the rest of this description, but is not restricted to this type of device.

A LED filament is understood to provide LED filament light and comprises a plurality of light emitting diodes (LEDs) arranged in a linear array. Preferably, the LED filament has a length L and a width W, wherein L>5 W. The LED filament may be arranged in a straight configuration or in a non-straight configuration such as for example a curved configuration, a 2D/3D spiral or a helix. Preferably, the LEDs are arranged on an elongated carrier like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods. The LED filament may comprise multiple sub-filaments. By "light-transmissive" particles is here intended particles which will allow light to pass and thus avoid the wavelength converting effect of the luminescent encapsulant. The particles may be completely non-luminescent, or at least have a different luminescent effect than the encapsulant. They may also be color absorbent, thereby changing the color of light. The particles may also cause a light-scattering effect.

The light emitted by the solid state light-emitting elements may have a first spectral distribution. The wavelength-converted light may have a second spectral distribution and the first spectral distribution may be different from the second distribution.

The invention is based on the realization that such light-transmissive particles may be used to disrupt the luminescent effect of the encapsulant material. So, instead of a homogenous wave-length conversion, some light from the light emitting elements will pass through the light-transmissive particles to avoid full wavelength conversion. In some embodiments, the particles are preferably transparent which may provide a better sparkling visual effect. The reason for this is that the light is less scattered in transparent particles compared to non-transparent or translucent particles.

The particles may have varying sizes and geometries, but for the effect to be clearly visible, the size of the particles, here defined as the "longest dimension extension", should be in the order of the encapsulant thickness over the light emitting surfaces. Preferably, the average longest dimension extension size is 0.4-1.5 times this thickness.

The expression "longest dimension extension" is to be broadly interpreted and simply refers to the longest extension of a particle in any dimension. In other words, a particle will have different extensions (size) in different dimensions (directions), and the "longest dimension extension" refers to the largest of these. For symmetrical particles, the dimension extensions of the particle may be the same in all dimensions. For particles with asymmetrical or arbitrary shape, the particle may have varying dimension extensions in different dimensions out of which at least one dimension extension may be the longest.

The term "average longest dimension extension" is used in order to account for the fact that in a sample of a plurality of particles with varying size and/or shape, the longest dimension extension of the particles may be different. Therefore, the average of all longest dimension extensions in the sample is used as a relevant measure.

In practice, it may be difficult to determine or establish the average longest dimension extension for a particle sample. In some situations, another measure, such as the "D50" value can be used as a relevant approximation. By D-value it is meant a particle diameter, when particles are conveniently modelled as spheres, which when all particles in a particle sample are arranged in order of ascending mass, divides the sample's mass into specified percentages. The percentage mass (wt %) below the diameter of interest is the number expressed after the "D". Specifically, D50 is the diameter at which approximately 50 wt % of the particle sample's mass has a diameter below the selected diameter. If the D50 value is within the relevant range, it can be assumed that the average longest dimension extension is also within the range.

In some embodiments the particles may have a D50 in the range of 0.3 to 6 mm, or more preferably 0.4 to 4 mm, or most preferably 0.5 to 2 mm.

Additionally or alternatively, another measure may be used to select the intended size of particles. For example, the particle sample can be selected such that at least 50 wt % or at least 75 wt % or at least 85 wt % of the particle sample will have a longest dimension extension within the relevant range.

Light emitted from a light emitting element will pass through the encapsulant and the particles therein. Depending on the density of particles, light from one light emitting element (in different directions) may impinge on several particles. In some embodiments, the density of particles is such that light emitted from a majority of the light emitting elements, e.g. as many as 90% of the light emitting elements, may impinge on at least two particles.

The invention allows adding more decorative features such as a sparkling effect e.g. to lighting devices with solid state light-emitting elements arranged inside a light bulb e.g. a LED filament lamp, resembling the look of an incandescent light bulb, thereby creating an even more favorable aesthetic appearance. These particles may have various geometrical shapes and orientations and be incorporated in the lighting devices with various production approaches which will further be discussed in the following summary and detailed description.

According to the invention, one advantage of adding light-transmissive particles in the vicinity of the solid state light-emitting elements is that it reduces further fabrication complications such as addition of external patterned layers or gratings and provides a self-contained lighting device with the sparkle effect. Additionally, this approach decreases the environmental footprint of each produced unit by decreasing the amount of materials such as plastic sheet portions, metallic coatings, glass plates, etc. per unit of lighting device. This in turn reduces the manufacturing complexity and costs per unit.

The larger the size of the light-transmissive particle, the less wavelength conversion will be provided by the encapsulant. In one example, the average longest dimension extension of the light-transmissive particles is greater than 0.8 times the layer thickness of the encapsulant over the light emitting surface(s), in which case the light emitted from the light emitting surface may be wavelength converted very little, or not at all, by the luminescent encapsulant. In another example, the average longest dimension extension of the light-transmissive particles is less than 0.8 times the layer thickness of the encapsulant over the light emitting surface(s), in which case the light emitted from the light emitting surface may still be more visibly wave-length converted, by the luminescent encapsulant.

For example, in the case of blue LEDs, light-transmissive particles having a size extending between 0.8 to 1.2 times the thickness of the encapsulant may provide a sparkle of a blue color. Whereas, a particle with the size in the range from 0.4 to 0.8 times the thickness of the encapsulant may provide a sparkle of a color in the red light wavelength end of the visible light spectrum.

The particles may be symmetrical, to ensure similar light conversion (or lack thereof) regardless of direction of light. However, it is preferable that the light-transmissive particles have an asymmetrical shape, to increase the irregularity of the sparkling effect. For example, the particles may have an extension in a vertical direction which is at least twice as large as an extension in a longitudinal and a lateral direction.

In the context of the present invention the directions and orientations such as vertical, longitudinal, and lateral directions need to be interpreted broadly and generally refer to the geometrical extensions of objects e.g. light-transmissive particles in a coordinate system such as a three-dimensional Cartesian coordinate system. The spatial extension and unique position of each point of the light-transmissive particles can therefore be defined in at least one plane of the coordinate system with a pair of numerical coordinates. By having the particle extend more (e.g. twice as much) in one of the three orthogonal directions (e.g. the vertical more than the longitudinal and lateral) an elongated (e.g. rice-shaped) particle is formed. By having the particle extend more in two of the three orthogonal directions (e.g. the vertical and longitudinal more than the lateral) a disc-shaped particle is formed.

According to a second aspect of the present invention there is provided a method of producing a lighting device, providing a sparkling visual effect, comprising providing at least one solid state light-emitting element mounted on a carrier substrate, each solid state light-emitting element configured to emit light from a light emitting surface, providing an encapsulant comprising a luminescent material, the encapsulant enclosing the light emitting surface(s) of the at least one solid state light-emitting element, and being configured to at least partly convert light emitted by the solid state light-emitting element to wavelength converted light, and providing a plurality of light-transmissive particles contained at least partly within the encapsulant, the light-transmissive particles having an average longest dimension extension in any dimension in the range 0.4 to 1.5 times a layer thickness of the encapsulant over the light emitting surface(s).

It is emphasized that the steps of the second aspect may be performed in any logical order e.g. providing an encapsulant enclosing the carrier substrate and the at least one solid state light-emitting element before providing the light-transmissive particles in the vicinity of the at least one solid state light-emitting element.

Effects and features of these first and second aspects of the present invention are largely analogous and the embodiments mentioned above are compatible with both of these two aspects of the invention.

In accordance with an exemplary embodiment of the present invention, the light-transmissive particles are mixed/dissolved into the encapsulant, before arranging the encapsulant on the carrier substrate.

It has been realized by the inventors that readily mixing the light-transmissive particles into the encapsulant has the advantage of facilitating the production process of the lighting devices and reducing the production cost. Further, with this process, the light-transmissive particles may be arbitrarily distributed within the encapsulant, to create an irregular visual effect.

In accordance with another exemplary embodiment, the light-transmissive particles are deposited in a particle retaining layer and the particle retaining layer is arranged on the carrier substrate. The order of these steps can also be reversed.

The particle retaining layer may be applied/deposited on any other part/side of the carrier substrate than the light emitting element. The particle retaining layer may be deposited in a continuous manner or in discontinuous portions in any desired layout which may be advantageous in creating customizable sparkle effects. The light-transmissive particles may be arbitrarily distributed in the particle-retaining layer.

This approach may lead to more efficient sparkle effect due to a more controlled process in depositing the particle-retaining layer with respect to the LED elements. Although the particle-retaining layer may be deposited anywhere on the substrate with respect to the LED elements, it has been found by the inventors that controlled deposition of the particle-retaining layer in close vicinity of the LED elements, increases the efficiency of the LED filaments in creating the sparkle effect. The lighting devices of this category may be preferred to the previously explained type where a higher quality and intensity of the sparkles is desired and therefore a more complex and costly production process is adopted.

In accordance with yet another exemplary embodiment, the light-transmissive particles may be deposited directly on the carrier substrate and/or light emitting elements. For example, the particles may be deposited on the substrate such that the particles only partially cover the LED elements and/or are located at a specific distance from respective LEDs. The light-transmissive particles may also be deposited on either side of the carrier substrate in varying shapes and layouts.

The advantage of direct deposition is that the conditions of growth and deposition of light-transmissive particles are precisely controllable thus leading to customizable sparkle effects from individual LEDs or from the LED filament. This category however requires costly fabrication equipment and a more complex production procedure.

According to the third aspect of the present invention there is provided a light bulb comprising a transparent shell, the light bulb comprising at least one of the lighting devices according to the first and second aspects of the present invention arranged within the shell and in electric connection to electric contacting points of the light bulb.

If the lighting devices are LED filaments, the light bulb may be referred to as a LED filament lamp. The LED filament lamp may e.g. comprise preferably three to nine LED filaments or more preferably four to six LED filaments.

The shell may be an envelope, substantially enclosing the lighting devices. The lamp way also comprise a base for connection of the lamp to a socket of a luminaire. The base is typically electrically connected with the lighting device.

With this aspect of the invention preferred features and advantages of the invention are readily available as in the previously discussed aspects of the invention, and vice versa.

These and other features of the present invention will in the following be further clarified with reference to the embodiments described hereinafter.

BRIEF DESCRIPTION OF THE DRAWINGS

The above objects, as well as additional objects, features and advantages of the present invention, will be more fully appreciated by reference to the following illustrative and non-limiting detailed description of embodiments of the present invention, when taken in conjunction with the accompanying drawings, wherein:

FIGS. 2a-2c show a schematic cross-sectional side view of a lighting device in accordance with at least one embodiment of the present invention;

FIGS. 3a-3c show schematic cross-sectional side views of a lighting device in accordance with some exemplary embodiments of the present invention.

Figure 1:
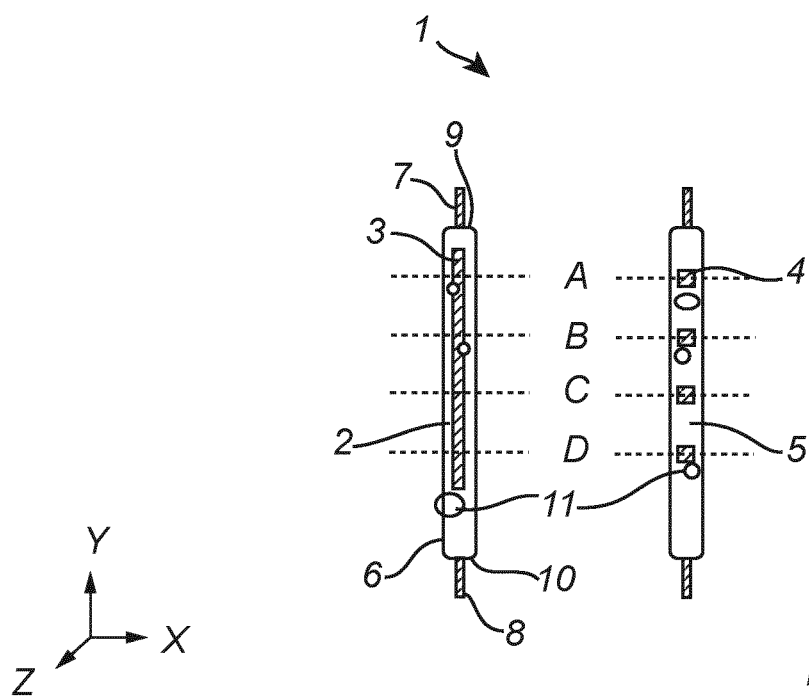
FIG. 1 shows a schematic cross-sectional top view of a lighting device in accordance with at least one embodiment of the present invention.

As illustrated in the figures, some features (including the particles, the encapsulant, etc.) are or may be exaggerated for illustrative purposes and, thus, are provided to illustrate the general structures of embodiments of the present invention. Like reference numerals refer to like elements throughout.

DETAILED DESCRIPTION OF EMBODIMENTS

In the present detailed description, embodiments of the present invention will be discussed with the accompanying figures. It should be noted that this by no means limits the scope of the invention, which is also applicable in other circumstances for instance with other types or variants of methods for producing lighting devices with sparkling effect or other types or variants of the lighting device with sparkle effect than the embodiments shown in the appended drawings. Further, that specific features are mentioned in connection to an embodiment of the invention does not mean that those components cannot be used to an advantage together with other embodiments of the invention.

The following description will use terms such as "top", "bottom", "inner", "outer", "side", etc. These terms generally refer to the views and orientations as shown in the drawings. The terms are used for the reader's convenience only and shall not be limiting.

Directions and extensions of the lighting device is discussed below in more details using a coordinate system. In essence, the vertical direction or the z-direction is orthogonal or perpendicular to the carrier substrate. The longitudinal direction or the y-direction is parallel to the longest extension of the lighting device. The lateral direction or the x-direction is orthogonal to both the y-direction and the z-direction. The x-direction may be parallel to the longest extension of the solid state light emitting element but it may also be a direction transverse to the longest extension of the solid state light emitting element.

FIG. 1 illustrates one example of a lighting device 1, comprising a carrier substrate 2, and at least one continuous 3 or discontinuous 4 portion of a solid state light emitting element arranged on top of the substrate 2. The light emitting element(s) is configured to emit light from a light emitting surface. The carrier may be transparent, to allow light from the light emitting elements to pass through it.

The solid state light emitting elements may be LEDs which have found widespread applications in a broad range of industries like lighting, automotive, and aviation industries. Thanks to the low energy consumption, longevity, compact size and fast switching characteristics. LEDs have specially attracted a lot of attention in lighting solutions due to their arguably fewer negative environmental impacts. An elongated LED lighting device 1 as shown in FIG. 1 is sometimes referred to as a LED filament.

In this example the carrier substrate has its longest extension in the y direction and the LEDs 3, 4 are arranged substantially parallel on the carrier substrate 2. In the example where the LEDs are discontinuous 4, the separation between the LEDs may form a plurality of gaps 5 between adjacent LEDs. In an alternative embodiment, the longest extension of the LEDs may be in a direction transverse or orthogonal to the longest extension of the carrier substrate. In more detail, when the longest extension of the carrier substrate is in the y direction, the longest direction of the plurality of LEDs 3, 4 may be in the x-direction or in any orientation with respect to x and y directions. It is to be understood that each solid state light emitting element 3, 4 or each carrier substrate 2 has a first and a second end portion arranged along the longest extension of the solid state light emitting element 3, 4 or the carrier substrate 2. The first and second end portions may also be arranged along or across any other extensions of the solid state light emitting element 3, 4 or the carrier substrate 2.

The lighting device further comprises an encapsulant 6 including luminescent material, here enclosing the carrier substrate and the LEDs. The encapsulant may e.g. include inorganic phosphor particles in a silicone matrix material. Alternatively, the encapsulant may only partially enclose the carrier substrate and the LEDs or different compositions of encapsulant e.g. different ratios of phosphor and silicone matrix, be used to enclose different parts of the carrier substrate and the LEDs of the same lighting device 1. The phosphor may be an inorganic phosphor, an organic phosphor, and/or quantum dots or rots. Examples of inorganic phosphor includes $Lu_3Al_5O_{12}$ (LuAG), yttrium aluminum garnet (YAG), ECAS, etc.

The encapsulant 6 is configured to provide wavelength conversion of the light emitted from the LEDs, for example when using blue LED elements, at least a part of blue light from the LEDs is absorbed by phosphor and turned into yellow light and/or red light. The blue LEDs may for example emit light in the wavelength range from 420 to 490 nm such as for example an emission in the wavelength range of 440 to 460 nm.

The lighting device may also comprise red LEDs in addition to the blue LEDs. The red LEDs emit red light. The red light emitted by the red LEDs may not be converted by the luminescent material. The red light emitted by the red LEDs may also show a sparkling visual effect.

In several embodiments, the LED filament may comprise a plurality of LEDs for example a linear array or a one-dimensional matrix of LEDs with at least 1×5, preferably 1×10, more preferably 1×20, or most preferably 1×30 matrix arranged on each or either side of the substrate. In one example the filament may comprise a 1×30 matrix of blue direct emitting LEDs arranged on each or either side of the substrate, a substrate made of transparent sapphire, an encapsulant partly made of silicone and phosphors e.g. a YAG and $K_2SiF_6$ (KSIF) phosphors mixture and the particles may be glass particles.

The LED filament preferably emits white light. The LED filament light has preferably a color temperature in the range from 2000 K to 6000 K, more preferably 2100 to 4000K, most preferably 2200 to 3000 K such as for example 2300 K or 2700 K. The LED filament light has preferably a color rendering index of at least 75, more preferably at least 80, most preferably at least 85. The white light emitted from the LED filament is preferably within 15 SDCM from the BBL (black body locus), more preferably with 10 SDCM, most preferably with 7 SDCM such as for example 5 or 3 SDCM.

In the illustrated example, the device further has first and second contacting electrodes 7, 8 arranged at a first 9 and a second 10 end portion of the carrier substrate 2. The contacting electrodes provide the electric contact to external electricity sources or any additional contacting points. Of course, a different placement of the electrodes is also possible.

According to the invention, the lighting device further comprises a plurality of light-transmissive particles 11 of any geometrical shape, partially or entirely contained within the encapsulant. Suitable materials for these particles are glass, quartz, sapphire, plastic e.g. PMMA or PC, silicone, etc.

Glass and silicone are preferred for high demanding applications i.e. higher lumen output (high power) LED filaments.

The size of the particles, i.e. the average longest dimension extension, is between 0.4 and 1.5 times the encapsulant layer thickness over the light emitting surfaces of the LEDs. According to one example, size of the light-transmissive particles 11 may be at least 0.4 times or at least 0.8 times the thickness d of the encapsulant. Additionally or alternatively, size of the light-transmissive particles may be at most 0.8 times or at most 1.2 times the thickness of the encapsulant 6.

FIG. 2 Illustrates a schematic cross sectional side view of the lighting device 1 of FIG. 1. In this example the cross sections have been taken across the lines A, B, C, and D in FIG. 1 with discontinuous LED portions 4 but it is readily understood that the same explanation may apply for cross sections along the same lines for the continuous LED portion 3. Cross section A in FIG. 2 shows a portion of the LED filament 1 with two example light rays emitted from the LED 4. Light ray 21 passes the encapsulant 6 and is fully wavelength converted and exits the LED filament 1 as converted light 21. Light ray 22 on the other hand will pass through the light-transmissive particle, and thus be less wave-length converted (or not at all). Light ray 22 may also be scattered by its interaction with the particle 11.

The color of the light 22 will depend on the size of the particle 11. In the case of a blue LED, a larger particle (e.g. 0.8 to 1.2 times the thickness of the encapsulant 6) will result in more blue sparkles, while smaller particles 11 (e.g. 0.4 to 0.8 times the thickness of the encapsulant 6) will result in sparkles closer to the red end of the visible light spectrum.

The particles may be situated at different positions and distances relative to the LED element. The particles may be in immediate or close contact with the LED element, as shown in cross sections A and D, or be on the opposite side of the carrier substrate 2 and the LED element 4 such as shown in cross section B and may not be present in the vicinity of the LED elements 4 as shown in cross section C in FIG. 2a. As it should also be appreciated in various other examples, the LED filament 1 may have more than one light emitting element 3, 4 on either and/or both sides of the carrier substrate as e.g. shown in FIG. 2b. Such light emitting elements 3, 4 may be provided as a continuous light-emitting portion 3 arranged continuously in the longest extension of the carrier substrate 2 in x or y directions or as discontinuous light emitting portions 4 arranged on either side of the carrier substrate 2. The discontinuous portions 4 may be arranged in any given orientation with respect to x or y directions. As additional examples, the lighting device 1, may have light emitting elements 3, 4 with different optical and material characteristics.

Further, the lighting device 1 may have more than one substrate 2 encapsulated within one encapsulant 6 as shown e.g. in FIG. 2c.

The thickness d of the encapsulant 6 is generally such that it may enclose the carrier substrate 2 and the LED elements 3, 4 entirely. However, such thickness may also exceed the thickness required to enclose the substrate 2 and the LED elements 3, 4. However, one or more light-transmissive particles 11 may only be partly enclosed by the encapsulant 6.

As an example, the thickness d may be in the order of mm, e.g. around 2-3 mm. If the thickness d is 2 mm, the average longest dimension extension of the particles should be in the range 0.8-3 mm.

Figure 2A:
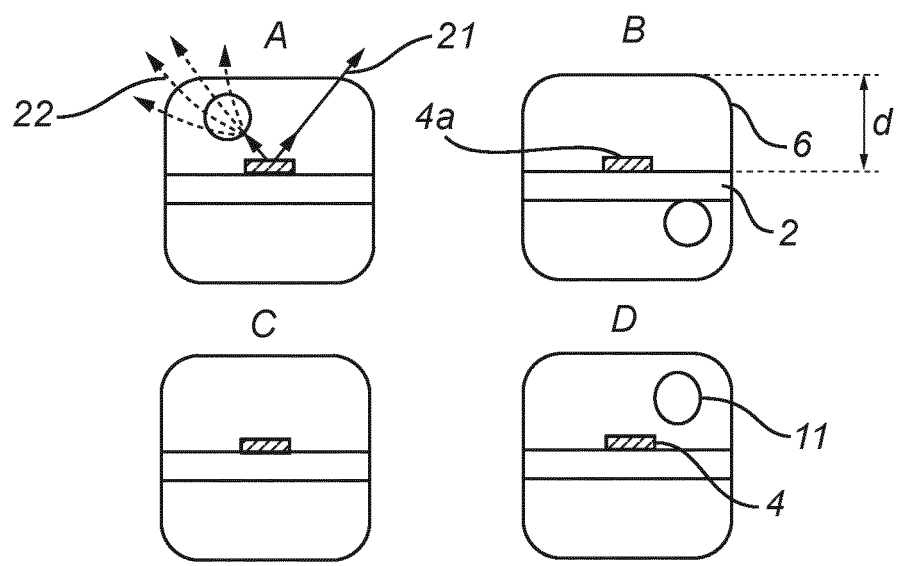

The encapsulant 6 may be substantially symmetrically provided around the light emitting devices, such that the distance from the light emitting surface 4a to the boundary of the encapsulant is substantially the same in all directions in the cross section (see e.g. FIG. 2a). In FIG. 2c, the encapsulant layer has a greater width than height. In this case, it may be more relevant to consider the thickness as the larger distance d'.

Depending on the particle size and the number of particles per volume, the ratio of total particle volume versus total volume (i.e. volume of encapsulant and particles) may be 10% or more, maybe even around 30%.

FIGS. 3a-c illustrate different embodiments of manufacturing methods of a lighting device according to the present invention.

In FIG. 3a the light-transmissive particles 11 are mixed in the encapsulant 6. The encapsulant may partly comprise in addition to phosphors, a silicone matrix material. More preferably the encapsulant is made of the silicone matrix material and inorganic phosphor particles.

The encapsulant is applied over the LED 3, 4 and the substrate 2 and encloses them. Alternatively, the step of inclusion of the light-transmissive particles 11 in the encapsulant 6 and application of encapsulant 6 on the LED 3, 4 and substrate 2 may be carried out simultaneously.

In a different approach, illustrated in FIG. 3b, a particle-retaining layer 30 may be used. In this example, the particle-retaining layer 30 is deposited on the carrier substrate 2 at least partially covering the LEDs 3, 4 or adjacent to the LEDs 3, 4, and the light-transmissive particles 11 are deposited in the particle-retaining layer 30. The particle-retaining layer 30 may be applied on either or on both sides of the carrier substrate 2. The encapsulant 6 is then applied over the substrate 2, LEDs 3, 4 and particle-retaining layer 30.

The light-transmissive particles 11 and the particle-retaining layer 30 may be made of various combinations of organosilicon compounds and/or silicone-based polymer compounds and their co-polymers or modified products including for example polydimethylsiloxane (PDMS) etc.

FIG. 3c illustrates yet another production approach of producing LED filaments 1 in accordance with yet another exemplary embodiment of the present invention. In this example the light-transmissive particle 31 is deposited directly on the carrier substrate 2 or LEDs 3, 4. The light-transmissive particle 31 may have a homogeneous or inhomogeneous geometry. The light-transmissive particle 31 may be deposited such that it covers at least partially the LEDs 3, 4. The deposition of the light-transmissive particle 31 may be on either or both sides of the carrier substrate 2. The deposition of the light-transmissive particle 31 may be performed with controlled and/or predetermined deposition parameters including but not limited to different material compositions, deposition ratios, deposition time, deposition temperature, deposition rate and the like. Thus the size, thickness, alignment, angles and orientation of the particles can be manipulated with high precision. The method of mixing or depositing the light-transmissive particles may be any known method in the art and as a non-limiting list may include evaporation, sputtering, spray-coating etc.

Figure 4:
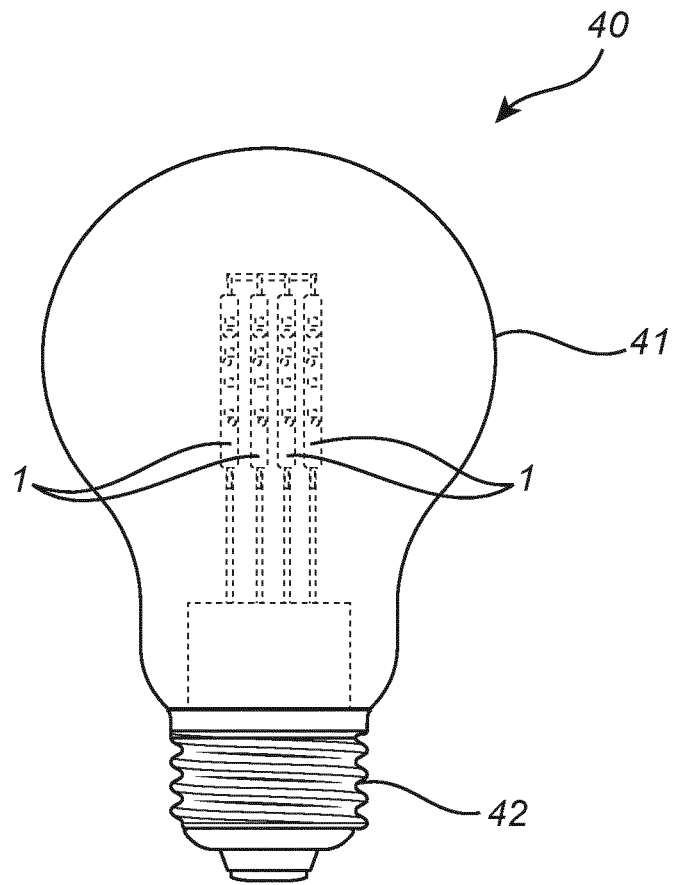
FIG. 4 shows a light bulb including lighting devices as shown in FIG. 1.

In FIG. 4, a light bulb 40 is shown, which comprises a transparent shell 41 surrounding a set of lighting devices 1 according to the present invention. The light bulb also has a connection terminal, here a conventional threaded base 42, to which the lighting devices are electrically connected.

The invention has now been described with reference to specific embodiments. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements. Further, other components of the lighting device such as first and second end portions of the carrier substrates, or the LEDs may for example be of any other curvature or orientation than the one shown in the figures. They may also be deposited such that their longest extension being in any direction between the x-, y- and z-directions. Hence, they need not be neither parallel nor perpendicular to the longest extension of the substrate. The skilled person also realizes that other conducting or semiconducting materials can be used as either electrodes or in the LED elements of the lighting device. Further, the skilled person will readily understand that various combinations of phosphors particles and silicone-based matrix materials are available for the encapsulant.

It should also be appreciated that in various examples, the size, thickness, and area of carrier substrates, number of contacting electrodes or geometrical shape of the LED filaments may vary. As a non-limiting example the LED filaments may have e.g. two substrates each with two LED elements. Each substrate thus may be connected to a pair of electrodes to address each LED individually. The LEDs may be connected to the electrodes in a series or parallel connections.

It should also be appreciated that in other examples the size, thickness, area, shape or number of light-transmissive particles or LED elements may vary appropriately. For instance, the light-transmissive particles may have any symmetrical or asymmetrical geometrical cross sectional layout such as rectangular, triangular, circular, elliptical, flat disk-like etc. or be provided and arranged in any other arbitrary or contorted layout. Light-transmissive particles may be homogenous or inhomogeneous particles.

The invention claimed is:

1. A lighting device providing a sparkling visual effect, said lighting device comprising:
   at least one solid state light-emitting element mounted on a carrier substrate, each solid state light-emitting element configured to emit light from a light emitting surface;
   an encapsulant comprising a luminescent material, the encapsulant enclosing the light emitting surfaces of said at least one solid state light-emitting element, and being configured to at least partly convert light emitted by the solid state light-emitting element to wavelength converted light; and
   a plurality of light-transmissive particles contained at least partly within said encapsulant, said light-transmissive particles having an average longest dimension extension in the range 0.4 to 1.5 times a layer thickness of said encapsulant over the light emitting surfaces, and
   wherein the carrier substrate is light transmissive and the encapsulant is provided on both planar surfaces of the carrier substrate.

2. The lighting device of claim 1, wherein the average longest dimension extension of said light-transmissive particles is greater than 0.8 times the layer thickness of said encapsulant over the light emitting surfaces.

3. The lighting device of claim 1, wherein the average longest dimension extension of said light-transmissive particles is less than 0.8 times the layer thickness of said encapsulant over the light emitting surfaces.

4. The lighting device according to claim 1, wherein said light-transmissive particles have a symmetrical shape.

5. The lighting device according to claim 1, wherein said light-transmissive particles have an asymmetrical shape.

6. The lighting device according to claim 5, wherein said light-transmissive particles have an extension in a vertical direction which is at least twice as large as an extension in a longitudinal and a lateral direction.

7. The lighting device according to claim 1, wherein said light-transmissive particles are arbitrarily distributed within said encapsulant.

8. The lighting device according to claim 1, wherein said light-transmissive particles are arbitrarily distributed within a particle-retaining layer, said particle retaining layer being arranged on said carrier substrate.

9. The lighting device according to claim 1, wherein said light-transmissive particles have been deposited directly on said carrier substrate or said light emitting elements.

10. A light bulb comprising:
    a transparent shell,
    at least one of the lighting devices according to claim 1 arranged within said shell and electric connected to an electric terminal of said light bulb.

11. A method of producing a lighting device with a sparkling visual effect, the method comprising:
    providing at least one solid state light-emitting element mounted on a light transmissive carrier substrate, each solid state light-emitting element configured to emit light from a light emitting surface;
    providing an encapsulant on both planar surfaces of the carrier substrate, said encapsulant comprising a luminescent material, the encapsulant enclosing the light emitting surfaces of said at least one solid state light-emitting element, and being configured to at least partly convert light emitted by the solid state light-emitting element to wavelength converted light; and
    providing a plurality of light-transmissive particles contained at least partly within the encapsulant, said light-transmissive particles having an average longest dimension extension in the range 0.4 to 1.5 times a layer thickness of said encapsulant over the light emitting surfaces.

12. The method of producing a lighting device according to claim 11, wherein the method further comprises mixing/dissolving said light-transmissive particles into said encapsulant, before arranging the encapsulant on the carrier substrate.

13. The method of producing a lighting device according to claim 11, wherein the method further comprises arranging a particle-retaining layer on the carrier substrate and depositing or mixing said light-transmissive particles in the particle-retaining layer.

14. The method of producing a lighting device according to claim 11, wherein the method further comprises depositing said light-transmissive particles directly on said carrier substrate and/or light emitting elements.

* * * * *